US012482757B2

(12) United States Patent
Chen et al.

(10) Patent No.: US 12,482,757 B2
(45) Date of Patent: Nov. 25, 2025

(54) SEMICONDUCTOR PACKAGES AND METHODS OF MANUFACTURING THEREOF

(71) Applicant: Taiwan Semiconductor Manufacturing Company, Ltd., Hsinchu (TW)

(72) Inventors: Ming-Fa Chen, Hsinchu (TW); Yun-Han Lee, Hsinchu (TW); Lee-Chung Lu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 616 days.

(21) Appl. No.: 17/897,648

(22) Filed: Aug. 29, 2022

(65) Prior Publication Data

US 2024/0071941 A1 Feb. 29, 2024

(51) Int. Cl.
*H01L 23/52* (2006.01)
*H01L 21/48* (2006.01)
(Continued)

(52) U.S. Cl.
CPC ........ *H01L 23/5386* (2013.01); *H01L 21/486* (2013.01); *H01L 24/08* (2013.01);
(Continued)

(58) Field of Classification Search
CPC ... H01L 23/5386; H01L 24/486; H01L 24/08; H01L 24/80; H01L 25/0655; H01L 23/5385; H01L 2224/80895; H01L 2224/80896; H01L 2924/13081; H01L 24/16; H01L 2224/16227; H01L 2224/16225; H01L 23/5226; H01L 2924/15311; H01L 25/0657; H01L 25/0652; H01L 23/49816; H01L 2224/16145; H01L 24/73;
(Continued)

(56) References Cited

U.S. PATENT DOCUMENTS

2016/0163650 A1* 6/2016 Gao .................... H01L 23/3128
438/126
2016/0276729 A1* 9/2016 Dang ....................... H01P 3/08

FOREIGN PATENT DOCUMENTS

TW   202203338 A   1/2022
TW   202203395 A   1/2022
TW   202228266 A   7/2022

OTHER PUBLICATIONS

Office Action issued in connection with Taiwan Appl. No. 112120584 dated May 7, 2024.

* cited by examiner

*Primary Examiner* — Niki H Nguyen
(74) *Attorney, Agent, or Firm* — FOLEY & LARDNER LLP

(57) ABSTRACT

A semiconductor device includes: a first chip including a plurality of first device features and a plurality of first interconnect structures disposed above the first device features; a second chip including a plurality of second device features and a plurality of second interconnect structures disposed above the second device features; and an interposer bonded to the first chip and the second chip, and disposed on an opposite side from the first and second device features with respect to the first and second interconnect structures; wherein the interposer includes a plurality of power rails configured to deliver power to the first and second chips.

20 Claims, 16 Drawing Sheets

(51) Int. Cl.
*H01L 23/00* (2006.01)
*H01L 23/538* (2006.01)
*H01L 25/065* (2023.01)
*H10D 30/01* (2025.01)
*H10D 30/43* (2025.01)
*H10D 30/67* (2025.01)
*H10D 62/10* (2025.01)
*H10D 64/01* (2025.01)

(52) U.S. Cl.
CPC .......... *H01L 24/80* (2013.01); *H01L 25/0655* (2013.01); *H10D 30/014* (2025.01); *H10D 30/43* (2025.01); *H10D 30/6735* (2025.01); *H10D 30/6757* (2025.01); *H10D 62/121* (2025.01); *H10D 64/01* (2025.01); *H10D 64/017* (2025.01); *H01L 23/5385* (2013.01); *H01L 2224/08225* (2013.01); *H01L 2224/80895* (2013.01); *H01L 2224/80896* (2013.01); *H01L 2924/13081* (2013.01)

(58) Field of Classification Search
CPC . H01L 2225/06517; H01L 2224/32145; H01L 23/49827; H01L 23/485; H01L 2224/16235; H01L 23/5384; H01L 24/81; H01L 2224/0401; H01L 2224/48227; H01L 21/486; H01L 21/743; H01L 2224/0603; H01L 2224/80203; H01L 2224/08121; H01L 25/072; H01L 2224/48145; H01L 2224/32137; H01L 2225/06513; H10D 30/014; H10D 30/6757; H10D 64/01; H10D 62/121; H10D 64/017; H10D 30/6735; H10D 30/43

See application file for complete search history.

SEMICONDUCTOR PACKAGES AND METHODS OF MANUFACTURING THEREOF

BACKGROUND

Semiconductor devices are ubiquitous in several applications and devices throughout various industries. For example, consumer electronics devices such as personal computers, cellular telephones, and wearable devices may contain several semiconductor devices. Similarly, industrial products such as instruments, vehicles, and automation systems frequently comprise a large number of semiconductor devices. As semiconductor manufacturing improves, semiconductors continue to be used in new applications which, in turn, leads to increasing demands of semiconductor performance, cost, reliability, etc.

These semiconductor devices are fabricated by a combination of front end of line ("FEOL") processes, which manufacture semiconductor (e.g., silicon) dies, and back end of line ("BEOL") processes, which package one or more of these dies into a semiconductor device that can interface with other devices. For example, the package may combine a plurality of semiconductor dies and can be configured to be attached to a printed circuit board or other interconnected substrate, which may, in turn, increase the thermal density of a semiconductor device.

Physical demands for device miniaturization and increasing connectedness are driving increases to semiconductor device density. Modern packaging technologies (e.g., package on package (PoP), Fan-Out packaging (FO), etc.) are driving miniaturization, intercommunication, and other improvements. The one or more dies of these modern packages may be interconnected or connected to package inputs and/or outputs (I/O) by bond wires, through-silicon vias (TSVs), metallization layers/vias coupled to the silicon dies, etc. While such connections use sophisticated techniques, further improvements are needed to advance the state of the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
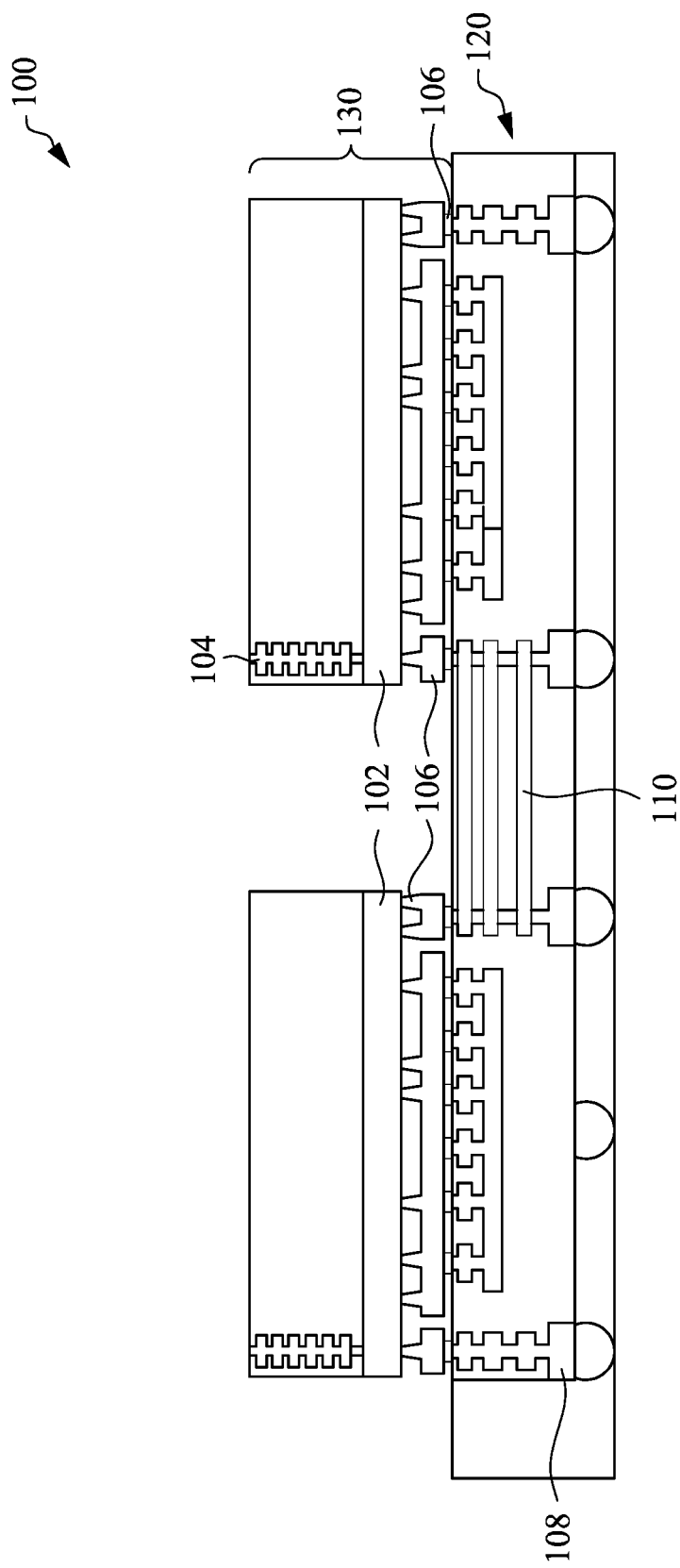
FIG. 1 illustrates a cross-sectional view of a portion of an example semiconductor packaging, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor package and method of fabricating the same. In one embodiment, a semiconductor package may include a chip including a plurality of device features. A device feature may include a gate-all-around (GAA) field-effect-transistor (FET) structure that allows a backside power rail to electrically couple to its source and/or drain. Typically, a backside power rail is formed on the backside of a wafer in order to reduce the standard cell height of semiconductor devices. The semiconductor package may further include an interposer instead of or in addition to various in-silicon/metallization features. For example, an interposer may contribute a relatively large capacitance or inductance to a semiconductor device (e.g., for voltage regulation purposes, filters, etc.). Increasingly complex and dense semiconductor device packages may benefit from the inclusion of such interposers, as they continue to require ever tighter voltage regulation and isolation (e.g., isolation of analog circuits such as RF from digital circuits, between high speed signals such as clocks and various transceivers, etc.).

An interposer comprises passive devices (e.g., resistors, inductors, transformers, diodes, etc.). For example, an interposer may comprise metal windings or other patterns, a silicon chip (which is also referred to as a die herein), signal or power filters, fuses, etc. The figures hereinafter only illustrates metal layers, which may function as a power rail, of an interposer for simplicity. One skilled in the art will understand that many other interposers may be substituted for those explicitly disclosed herein. For example, some interposers comprise a silicon chip. For more examples, some interposers may contain additional terminals or a ground pad along a surface.

For example in FIG. 1, the semiconductor package 100 includes a plural number of semiconductor chips 130, each of which includes a semiconductor device 102 and a plurality of interconnect structures 104. The semiconductor device 102 may include a plurality of device features, which may be a number of GAA transistors, formed on the front side, each of which includes a number of channel layers with two ends coupled to source/drain structures. Details of the GAA transistors will be discussed in further detail below (e.g., FIGS. 3 to 19).

On the front side, the semiconductor chips 130 also includes a number of interconnect structures 104 that are (e.g., electrically and physically) coupled to one or more of the GAA transistors. The interconnect structures 104 are typically formed of metal, and thus, may sometimes be referred to as frontside metals. The interconnect structure may sometimes be referred to as interconnect (metallization) layers such as Metal 0 (e.g. M0), Metal 1 (e.g. M1) layer, etc. While the drawings herein (e.g. FIG. 1 and FIGS. 21A-B) show fourteen layers (M0~M13), a person of ordinary skill in the art would understand that any desired number of layers may be used.

In addition, the semiconductor package 100 includes a number of interconnect structures 106 to be connected to the backside of the semiconductor device 102. The interconnect structures 106 may be coupled (e.g., electrically and physically) to one or more of the GAA transistors. The interconnect structures 106 are typically formed of metal, and thus, may sometimes be referred to as backside metals, or backside interconnect structures. In some embodiments of the present disclosure, the backside interconnect structures 106 may be formed in a bottommost one (when flipping the semiconductor package 100) of backside metallization layers, which is sometimes referred to as "BM0."

In some embodiments, the semiconductor package 100 further includes an interposer 120, which includes one or more other backside metallization layers 108, at least one of which can carry power supply voltages (e.g., $V_{DD}$, $V_{SS}$). While the drawings herein (e.g. FIG. 1 and FIGS. 21A-B) show five metallization layers (BM1 BM5), a person of ordinary skill in the art would understand that any desired number of layers may be used. The metallization layers 108 of interposer 120 is patterned such that the metallization layer BM1 of the interposer 120 overlaps with the metallization layer BM0 of the GAA transistor. Because the metal layers are in contact with each other (e.g., through hybrid bonding), the semiconductor packaging can be further miniaturized by not using the microbumps that are typically employed in semiconductor packaging manufacturing processes.

In accordance with some embodiments of the present disclosure, the interposer 120 may also include a plurality of signal lines 110, forming a die-to-die connection between a plurality of semiconductor devices 102. For example, through the plurality of signal lines 110, signals communicated between the first and second chips may be propagated. By including an interposer, which includes a plurality of metallization layers, at least one of which carries power supply voltages, and an interconnect structure forming a die-to-die connection between a plurality of devices, fabrication process is simplified and the cost of semiconductor packaging is reduced.

Figure 2:
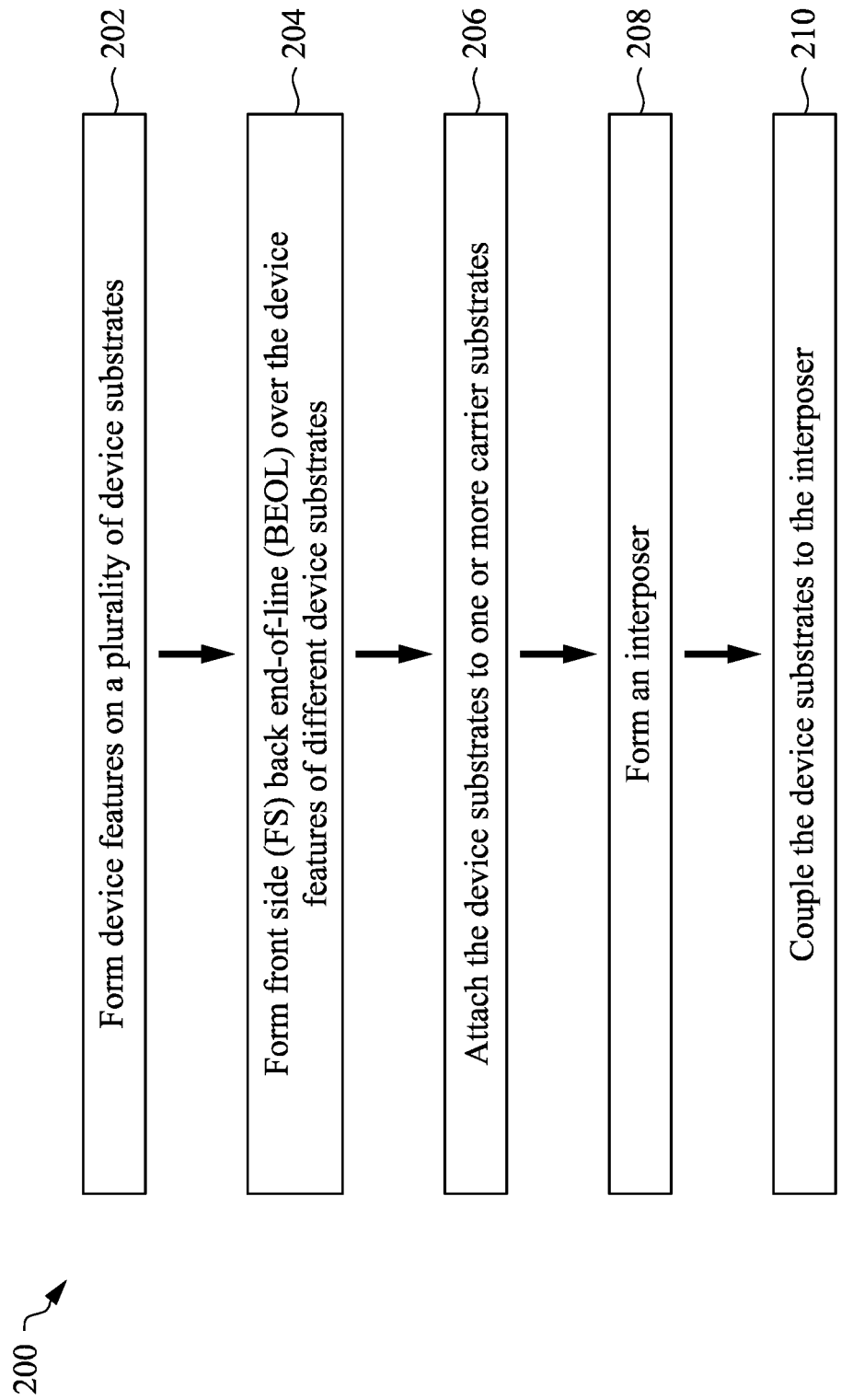
FIG. 2 is an example flow chart of a method for fabricating a semiconductor package, in accordance with some embodiments.

FIG. 2 illustrates a flow chart of an example method for making a semiconductor package in accordance with some embodiments. It should be noted that process 200 is merely an example and is not intended to limit the present disclosure. Accordingly, it is understood that additional steps/operations may be provided before, during, and after process 200 of FIG. 2, and that some other operations may only be briefly described herein. Furthermore, it is understood that the steps/operations described may not be limiting in order. That is, certain steps/operations may occur simultaneously or in a different order than depicted herein.

In brief overview, the process 200 starts with operation 202 of forming device features on a plurality of device substrates. The process 200 proceeds to operation 204 of forming front side (FS) back end-of-line (BEOL) over the device features of different device substrates. The operations 202 and 204 may be further understood to include process 400 of FIG. 4, which will be further described below. The process 200 proceeds to operation 206 of attaching the device substrates to one or more carrier substrates. The operation 206 may be incorporated also be in the process 400 such that the device substrate may be attached to one or more carrier substrates before forming FS BEOL over the device features of different device substrates. The process 200 proceeds to the operation 208 of forming an interposer, and further proceeds to operation 210 of coupling the device substrates to the interposer.

Figure 3:
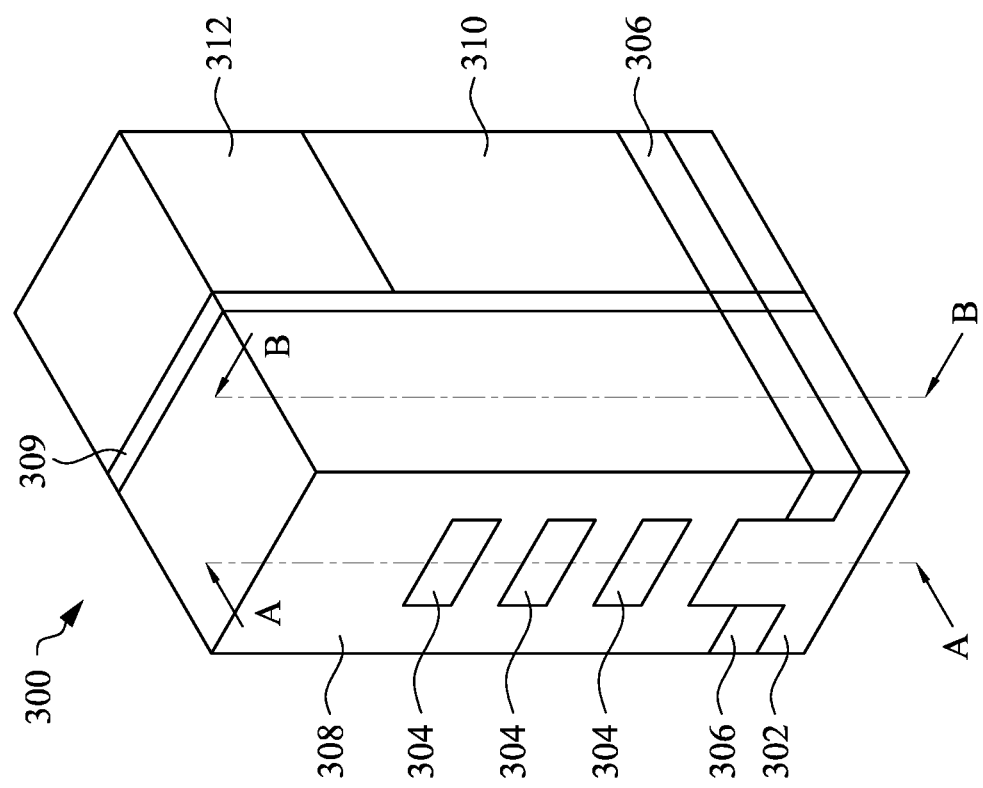
FIG. 3 illustrate an example semiconductor device, in accordance with some embodiments.

FIG. 3 illustrates a perspective view of an example gate-all-around (GAA) field-effect-transistor (FET) device 300, in accordance with some embodiments. The GAA FET device 300 includes a substrate 302 and a number of semiconductor layers (e.g., nanosheets, nanowires, or otherwise nanostructures) 304 above the substrate 302. The semiconductor layers 304 are vertically separated from one another, which can collectively function as a (conduction) channel of the GAA FET device 300. Isolation regions/structures 306 are formed on opposing sides of a protruding portion of the substrate 302, with the semiconductor layers 304 disposed above the protruding portion. A gate structure 308 wraps around each of the semiconductor layers 304 (e.g., a full perimeter of each of the semiconductor layers 304). A spacer 309 extends along each sidewall of the gate structure 308. Source/drain structures are disposed on opposing sides of the gate structure 308 with the spacer 309 disposed therebetween, e.g., source/drain structure 310 shown in FIG. 4. An interlayer dielectric (ILD) 312 is disposed over the source/drain structure 310.

The GAA FET device shown in FIG. 3 is simplified, and thus, it should be understood that one or more features of a completed GAA FET device may not be shown in FIG. 3. For example, the other source/drain structure opposite the gate structure 308 from the source/drain structure 310 and the ILD disposed over such a source/drain structure are not shown in FIG. 3. Further, FIG. 3 is provided as a reference to illustrate a number of cross-sections in subsequent figures. As indicated, cross-section A-A is cut along a longitudinal axis of the semiconductor layers 304 and in a direction of a current flow between the source/drain structures; cross-section B-B is cut along a longitudinal axis of the gate structure 308. Subsequent figures refer to these reference cross-sections for clarity.

Figure 4:
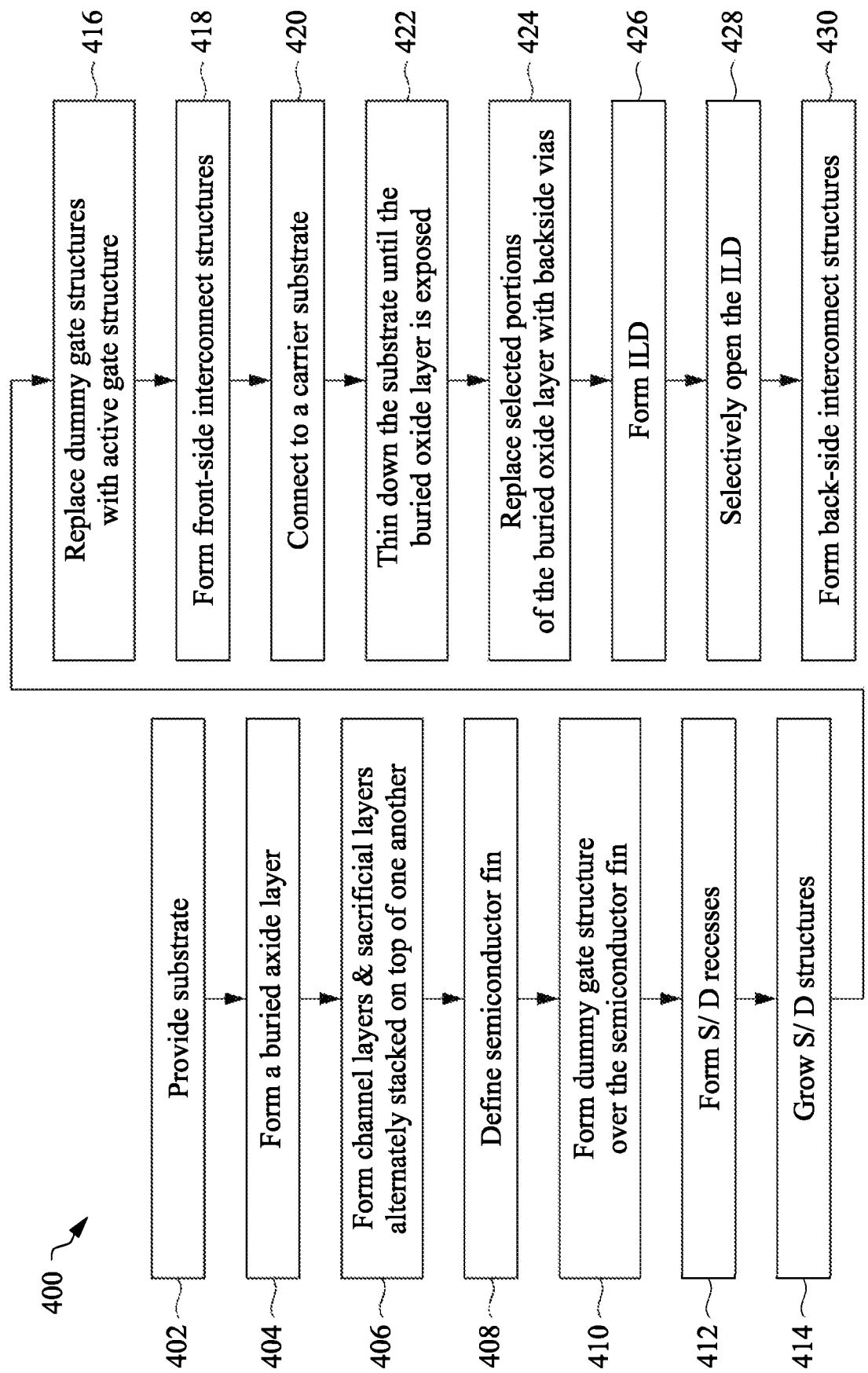
FIG. 4 is an example flow chart of a method for fabricating a semiconductor device, in accordance with some embodiments.

FIG. 4 illustrates a flow chart of an example method for making a GAA FET device (e.g., 300 of FIG. 3) in accordance with some embodiments. It should be noted that process 400 is merely an example and is not intended to limit the present disclosure. Accordingly, it is understood that additional steps/operations may be provided before, during, and after process 400 of FIG. 4, and that some other operations may only be briefly described herein. Operations of process 400 may be associated with cross-sectional views of example semiconductor device 102 at various fabrication stages as shown in FIGS. 5, 6, 7, 8, 9, 10, 11, 12, 13, 14, 15, 16, 17, 18, and 19 respectively, which will be discussed in further detail below.

In brief overview, the process 400 starts with operation 402 of providing a substrate. Then, the process 400 can proceed to operation 404 of forming a buried oxide layer. Then, the process 400 proceeds to operation 406 of forming channel layers and sacrificial layers alternatively stacked on top of one another. The process 400 proceeds to operation 408 of defining the semiconductor fin. The process 400 proceeds to operation 410 of forming a dummy gate structure over the semiconductor fin. The process 400 proceeds to operation 412 of forming a source/drain recess. The process 400 proceeds to operation 414 of growing source/drain structures. The process 400 proceeds to operation 416 of replacing the dummy gate structures with active gate structures. The process 400 proceeds to operation 418 of forming frontside interconnect structures. The process 400 proceeds to operation 420 of connecting the workpiece to a carrier substrate. The process 400 proceeds to operation 422 of thinning down the substrate until the buried oxide layer is exposed. The process 400 proceeds to operation 424 of replacing selected portions of the buried oxide layer with backside vias. The process 400 proceeds to operation 426 of forming another interlayer dielectric (ILD). The process 400 proceeds to operation 428 of selectively opening the ILD. The process 400 proceeds to operation 430 of forming backside interconnect structures.

As mentioned above, FIGS. 5-19 illustrate cross-sectional views of an example semiconductor chip during various fabrication stages, made by process 400, in accordance with some embodiments. For example, FIGS. 5-8 and 10-19 are cross-sectional views of the chip taken at various fabrication stages cut along line A-A of FIG. 3, and FIG. 9 is a cross-sectional view of the chip taken at a fabrication stage cut along line B-B of FIG. 3. Furthermore, the semiconductor chip in some embodiments may be n-type or p-type. Although FIGS. 5-19 illustrate the chip including a GAA transistor, it is understood that the GAA transistor may include a number of other devices such as inductors, fuses, capacitors, coils, etc. which are not shown in FIGS. 5-19 for purposes of clarity of illustration.

Figure 5:
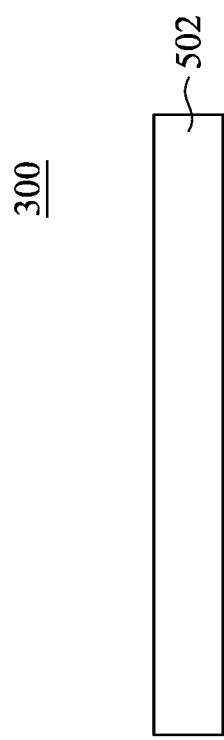
FIGS. 5, 6, 7, 8, 9, 10, 11, 12, 13, 14, 15, 16, 17, 18, and 19 illustrate cross-sectional views of an example semiconductor device during various fabrication stages, made by the method of FIG. 4, in accordance with some embodiments.

Corresponding to operation 402, FIG. 5 is a cross-sectional view of the GAA FET device 300 including a semiconductor substrate 502 at one of the various stages of fabrication. The cross-sectional view of FIG. 5 is cut in a direction along the lengthwise direction of an active/dummy gate structure of the semiconductor device 300 (e.g., cross-section A-A indicated in FIG. 3).

The substrate 502 may be a semiconductor substrate, such as a bulk semiconductor, a semiconductor-on-insulator (SOI) substrate, or the like, which may be doped (e.g., with a p-type or an n-type dopant) or undoped. The substrate 502 may be a wafer, such as a silicon wafer. Other substrates, such as a multi-layered or gradient substrate may also be used. In some embodiments, the semiconductor material of the substrate 502 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 6:
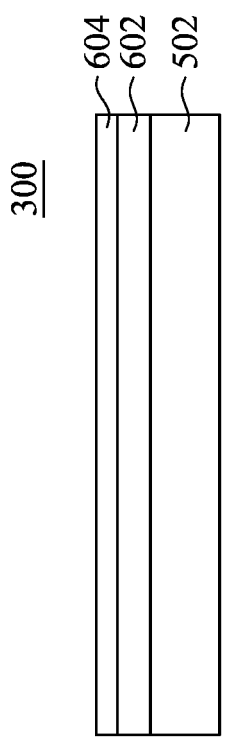

Corresponding to operation 404, FIG. 6 is a cross-sectional view of the semiconductor device 300 including a buried oxide layer 602 at one of the various stages of fabrication. The semiconductor device 300 includes a silicon on insulator (SOI) device which includes a layer of a semiconductor material 604 formed on the buried oxide layer 602. The cross-sectional view is cut along A-A indicated in FIG. 3.

Figure 7:
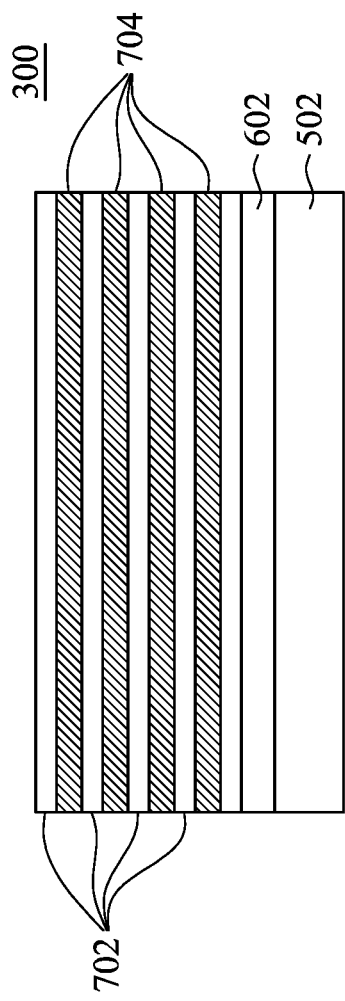

Corresponding to operation 406, FIG. 7 is a cross-sectional view of the semiconductor device 300 including a plurality of sacrificial layers 702 and channel layers 704 at one of the various stages of fabrication. The cross-sectional view is cut along A-A indicated in FIG. 3.

A number of sacrificial layers 702 and a number of channel layers 704 are alternatingly disposed on top of one another to form a stack. For example, one of the channel layers 704 is disposed over one of the sacrificial layers 702, then another one of the sacrificial layers 702 is disposed over the channel layer 704, so on and so forth. The stack may include any number of alternately disposed sacrificial and channel layers 702 and 704. For example in the illustrated embodiments of FIG. 7 (and the following figures), the stack may include 4 sacrificial layers 702, with 4 channel layers 704 alternatingly disposed therebetween and with one of the channel layers 704 being the topmost semiconductor layer. It should be understood that the semiconductor device 300 can include any number of sacrificial layers and any number of channel layers, with either one of them being the topmost layer, while remaining within the scope of the present disclosure.

The sacrificial and channel layers 702 and 704 may have respective different thicknesses. Further, the sacrificial layers 702 may have different thicknesses from one layer to another layer. The channel layers 704 may have different thicknesses from one layer to another layer. The thickness of each of the sacrificial and channel layers 702 and 704 may range from few nanometers to few tens of nanometers. The first layer of the stack may be thicker than other sacrificial and channel layers 702 and 704. In an embodiment, each of the sacrificial layers 702 has a thickness ranging from about 5 nanometers (nm) to about 20 nm, and each of the channel layers 704 has a thickness ranging from about 5 nm to about 20 nm.

The two sacrificial and channel layers 702 and 704 may have different compositions. In various embodiments, the two sacrificial and channel layers 702 and 704 have compositions that provide for different oxidation rates and/or different etch selectivity between the layers. In an embodiment, the sacrificial layers 702 may each include silicon germanium ($Si_{1-x}Ge_x$), and the channel layers may each include silicon (Si). In an embodiment, each of the channel layers 704 is silicon that may be undoped or substantially dopant-free (i.e., having an extrinsic dopant concentration from about 0 $cm^{-3}$ to about $1 \times 10^{17}$ $cm^{-3}$), where for example, no intentional doping is performed when forming the channel layers 704 (e.g., of silicon).

In various embodiments, the channel layers 704 may be intentionally doped. For example, when the semiconductor device 300 is configured as an n-type transistor (and operates in an enhancement mode), each of the channel layers 704 may be silicon that is doped with a p-type dopant such as boron (B), aluminum (Al), indium (In), and gallium (Ga); and when the semiconductor device 300 is configured as a p-type transistor (and operates in an enhancement mode), each of the channel layers 704 may be silicon that is doped with an n-type dopant such as phosphorus (P), arsenic (As), antimony (Sb). In another example, when the semiconductor device 300 is configured as an n-type transistor (and operates in a depletion mode), each of the channel layers 704 may be silicon that is doped with an n-type dopant instead; and when the semiconductor device 300 is configured as a p-type transistor (and operates in a depletion mode), each of the channel layers 704 may be silicon that is doped with a p-type dopant instead.

In some embodiments, each of the sacrificial layers 702 is $Si_{1-x}Ge_x$ that includes less than 50% (x<0.5) Ge in molar ratio. For example, Ge may comprise about 15% to 35% of the sacrificial layers 702 of $Si_{1-x}Ge_x$ in molar ratio. Furthermore, the sacrificial layers 702 may include different compositions among them, and the channel layers 704 may include different compositions among them. Either of the sacrificial and channel layers 702 and 704 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the sacrificial and channel layers 702 and 704 may be chosen based on providing differing oxidation rates and/or etch selectivity.

The sacrificial and channel layers 702 and 704 can be epitaxially grown from the semiconductor substrate 502. For example, each of the sacrificial and channel layers 702 and 704 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 502 extends upwardly, resulting in the sacrificial and channel layers 702 and 704 having the same crystal orientation with the semiconductor substrate 502.

Figure 8:
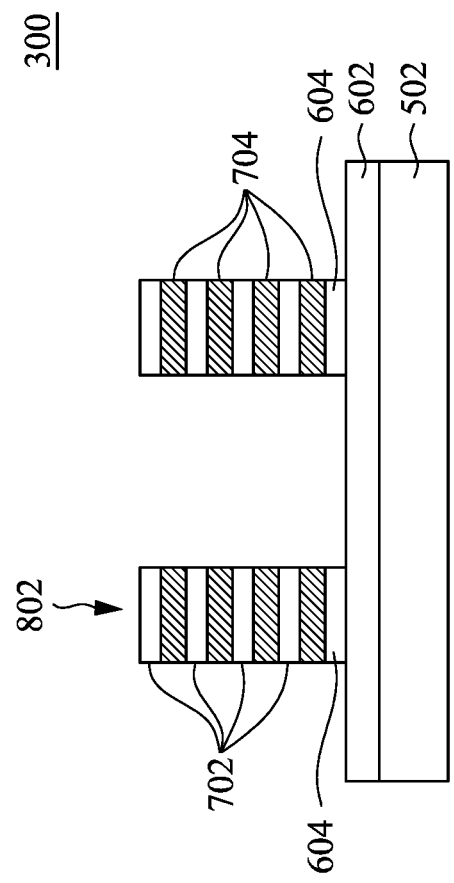
Figure 9:
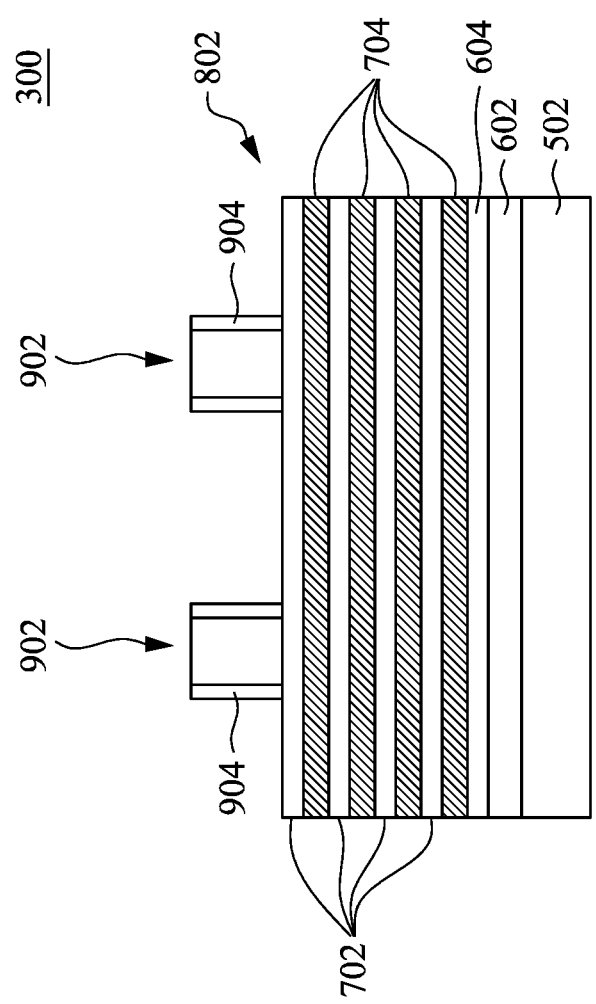

Corresponding to operation 408, FIG. 8 is a cross-sectional view of the semiconductor device 300 including a semiconductor fin structure 802 at one of the various stages of fabrication. The cross-sectional view is cut along B-B indicated in FIG. 3. Upon growing the sacrificial and channel layers 702 and 704 on the semiconductor substrate 502 (as a stack), the stack may be patterned to form the fin structure 802, as shown in FIG. 8. The fin structure 802 is elongated along a lateral direction and includes a stack of patterned sacrificial layers 702 and channel layers 704 interleaved with each other. The fin structure 802 is formed by patterning the stack of sacrificial and channel layers 702 and 704 and the semiconductor substrate 502 using, for example, photolithography and etching techniques.

For example, a mask layer (which can include multiple layers such as, for example, a pad oxide layer and an overlying hardmask layer) is formed over the topmost semiconductor layer of the stack (e.g., channel layer 704 in FIG. 8). The pad oxide layer may be a thin film comprising silicon oxide formed, for example, using a thermal oxidation process. The pad oxide layer may act as an adhesion layer between the topmost channel layer 704 and the hardmask layer. In some embodiments, the hardmask layer may include silicon nitride, silicon oxynitride, silicon carbonitride, the like, or combinations thereof. In some other embodiments, the hardmask layer may include a material similar as a material of the sacrificial and channel layers 702/704 such as, for example, $Si_{1-y}Ge_y$, Si, etc., in which the molar ratio (y) may be different from or similar to the molar ratio (x) of the sacrificial layers 702. The hardmask layer may be formed over the stack (i.e., before patterning the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the sacrificial and channel layers 702 and 704 and the substrate 502 to form the fin structure 802, thereby defining trenches (or openings) between adjacent fin structures. When multiple fin structures are formed, such a trench may be disposed between any adjacent ones of the fin structures. In some embodiments, the fin structure 802 is formed by etching trenches in the sacrificial and channel layers 702 and 704 and substrate 502 using, for example, reactive ion etching (RIE), neutral beam etching (NBE), the like, or combinations thereof. The etching may be anisotropic. In some embodiments, the trenches may be strips (when viewed from the top) parallel to each other, and closely spaced with respect to each other. In some embodiments, the trenches may be continuous and surround the respective fin structures.

Corresponding to operation 410, FIG. 9 is a cross-sectional view of the semiconductor device 300 including a dummy gate structure 902 at one of the various stages of fabrication. The cross-sectional view of FIG. 9 is cut in along A-A indicated in FIG. 3. The dummy gate structure 902 is formed over the fin structure 802.

The dummy gate structure 902 may include a dummy gate dielectric and a dummy gate, which are not shown separately for purpose of clarity. To form the dummy gate structure 902, a dielectric layer may be formed over the fin structure 802. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structure 902.

Upon forming the dummy gate structure 902, a gate spacer 904 may be formed on opposing sidewalls of the dummy gate structure 902, as shown in FIG. 9. The gate spacer 904 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 904. The shapes and formation methods of the gate spacer 904, as illustrated in FIG. 9, are merely non-limiting examples, and other shapes and formation methods are possible. These and other variations are fully intended to be included within the scope of the present disclosure.

Figure 10:
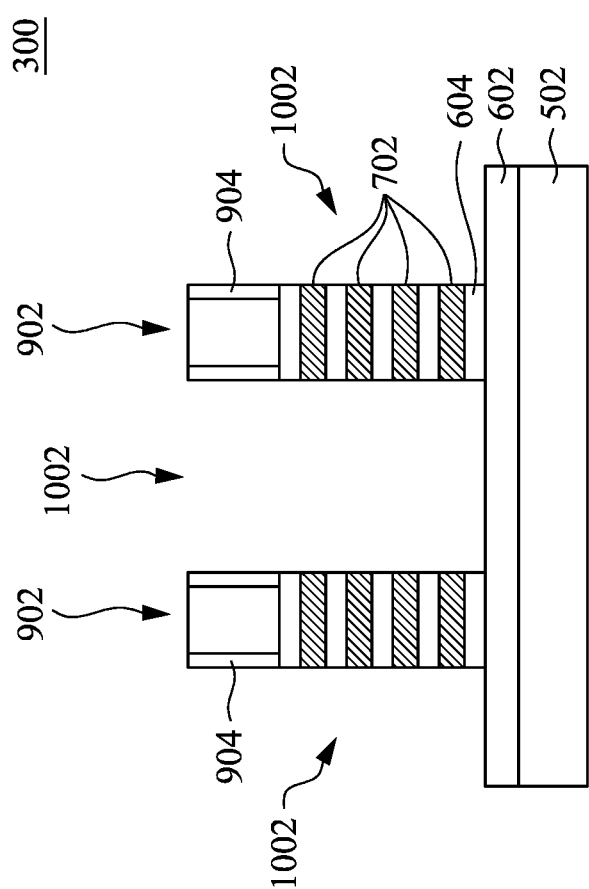

Corresponding to operation 412, FIG. 10 is a cross-sectional view of the semiconductor device 300 including a source/drain (SD) recess 1002 at one of the various stages of fabrication. The cross-sectional view is cut along A-A indicated in FIG. 3. The dummy gate structure 902 (together with the gate spacer 904) can serve as a mask to recess (e.g., etch) the non-overlaid portions of the fin structure 802, which results in the remaining fin structure 802 having respective remaining portions of the sacrificial layers 702 and channel layers 704 alternately stacked on top of one another. As a result, recesses 1002 can be formed on opposite sides of the remaining fin structure 802.

The recessing step to form the recesses 1002 may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof to control the above-described etching rates.

Figure 11:
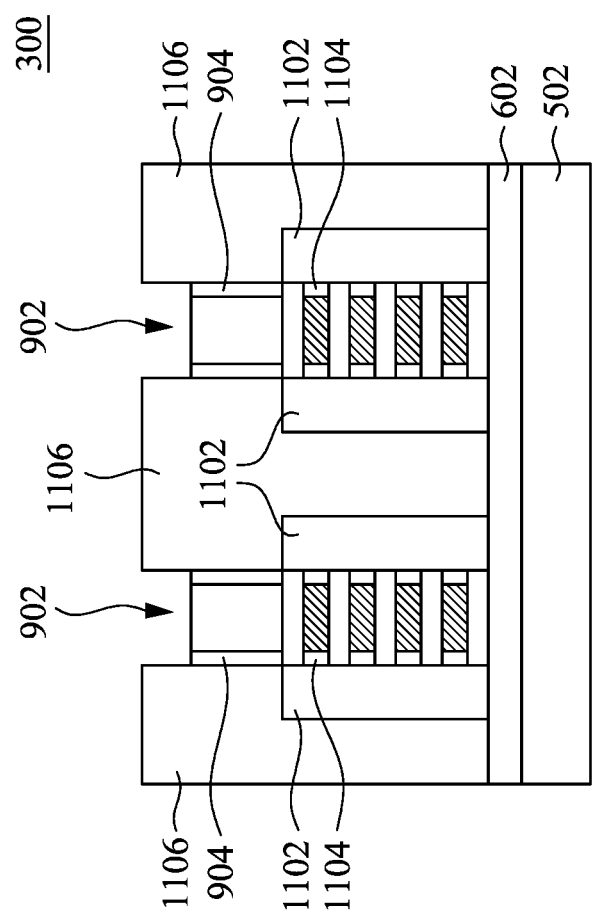

Corresponding to operation 414, FIG. 11 is a cross-sectional view of the semiconductor device 300 including source/drain structures 1102 and interlayer dielectric (ILD) 1106, at one of the various stages of fabrication. The source/drain structures 1102 are disposed in the recess 1002. As such, (a lower portion of) the source/drain structure 1102 can inherit the dimensions and profiles of the recess 1002 (e.g., extending into the substrate 502). The source/drain structures 1102 are formed by epitaxially growing a semiconductor material in the recesses 1002 using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

Prior to forming the source/drain structures 1102, end portions of the semiconductor layers can be removed (e.g., etched) using a "pull-back" process to pull the sacrificial layers 702 of the fin structures 802 back by a pull-back distance. In an example where the channel layers 704 include Si, and the sacrificial layers 702 include SiGe, the pull-back process may include a hydrogen chloride (HCl) gas isotropic etch process, which etches SiGe without attacking Si. As such, the Si layers (nanostructures, e.g. channel layers) 704 may remain intact during this process. Consequently, a pair of recesses can be formed on the ends of each sacrificial layer 702, with respect to the neighboring channel layers 704. Next, such recesses along the ends of each sacrificial layer 702 can be filled with a dielectric material to form inner spacers 1104, as shown in FIG. 11. The dielectric material for the inner spacers 1104 may include silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacer for transistors.

As further shown in FIG. 11, the source/drain structures 1102 are disposed on the opposite sides of the fin structures 802 to couple to the channel layers 704 of the fin structure 802 and separate from the sacrificial layers 702 of the fin structure 802 with the inner spacer 1104 disposed therebetween. Further, the source/drain structures 1102 and 1102 are separated from the dummy gate structure 902, with (at least a lower portion of) the gate spacer 904.

According to various embodiments of the present disclosure, the channel layers 704 in each of the fin structures 802 may collectively function as the conductive channel of a completed transistor. The sacrificial layers 702 in each of the fin structures 802 may be later replaced with a portion of an active gate structure 1202 that is configured to wrap around the corresponding channel layers.

In some embodiments, the ILD 1106 can be concurrently formed to respectively overlay the source/drain structures 1102. The ILD 1106 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD. The dielectric layer can function as a protection layer to prevent or reduces the loss of the ILD in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level top surface for the dielectric layer. After the planarization process, the top surface of the dielectric layer is level with the top surface of the dummy gate structures 902, in some embodiments.

Figure 12:
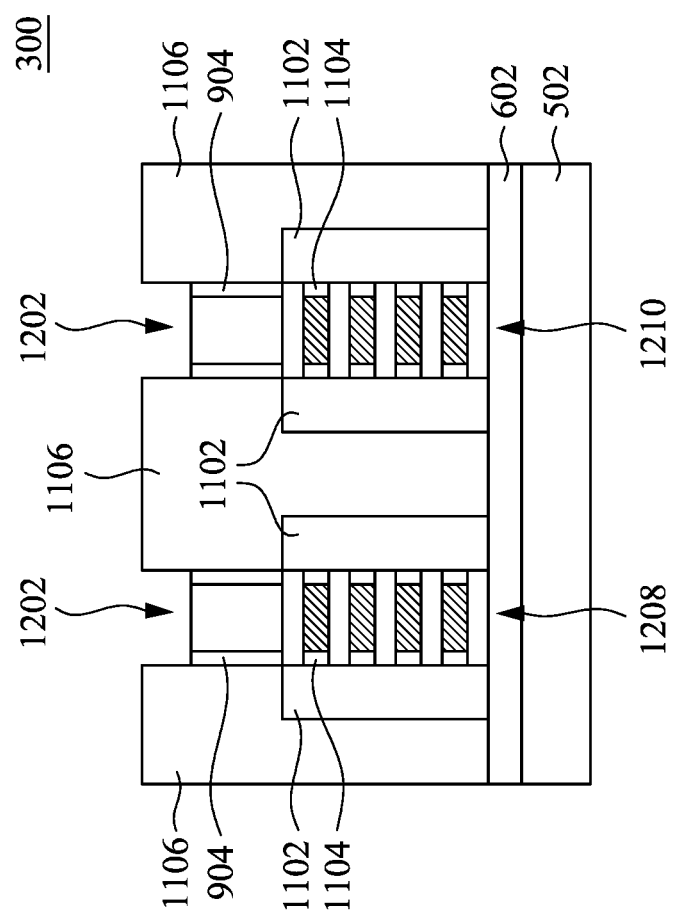

Corresponding to operation 416, FIG. 12 is a cross-sectional view of the semiconductor device 300 including active gate structures 1202, at one of the various stages of fabrication. The cross-sectional views are cut along A-A indicated in FIG. 3.

Subsequently to forming the ILD 1106, the dummy gate structures 902 and the (remaining) sacrificial layers 702 may be concurrently removed. In various embodiments, the dummy gate structures 902 and the sacrificial layers 702 can be removed by applying a selective etch (e.g., a hydrochloric acid (HCl)), while leaving the channel layers 704 substantially intact. After the removal of the dummy gate structures 902, a gate trench, exposing respective sidewalls of each of the channel layers 704, may be formed. After the removal of the sacrificial layers 702 to further extend the gate trench, respective bottom surface and/or top surface of each of the channel layers 704 may be exposed. Consequently, a full circumference of each of the channel layers 704 can be exposed. Next, the active gate structure 1202 is formed to wrap around each of the channel layers 704 of the fin (or stack) structure 802.

The active gate structures 1202 each include a gate dielectric and a gate metal, in some embodiments. The gate dielectric can wrap around each of the channel layers 704, e.g., the top and bottom surfaces and sidewalls. The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 704.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Upon forming the active gate structures 1202, a number of transistors can be defined (or otherwise formed). For example, a transistor that adopts the active gate structure 1202, source/drain structures 1102 as its gate, drain, source, respectively, can be formed.

Figure 13:
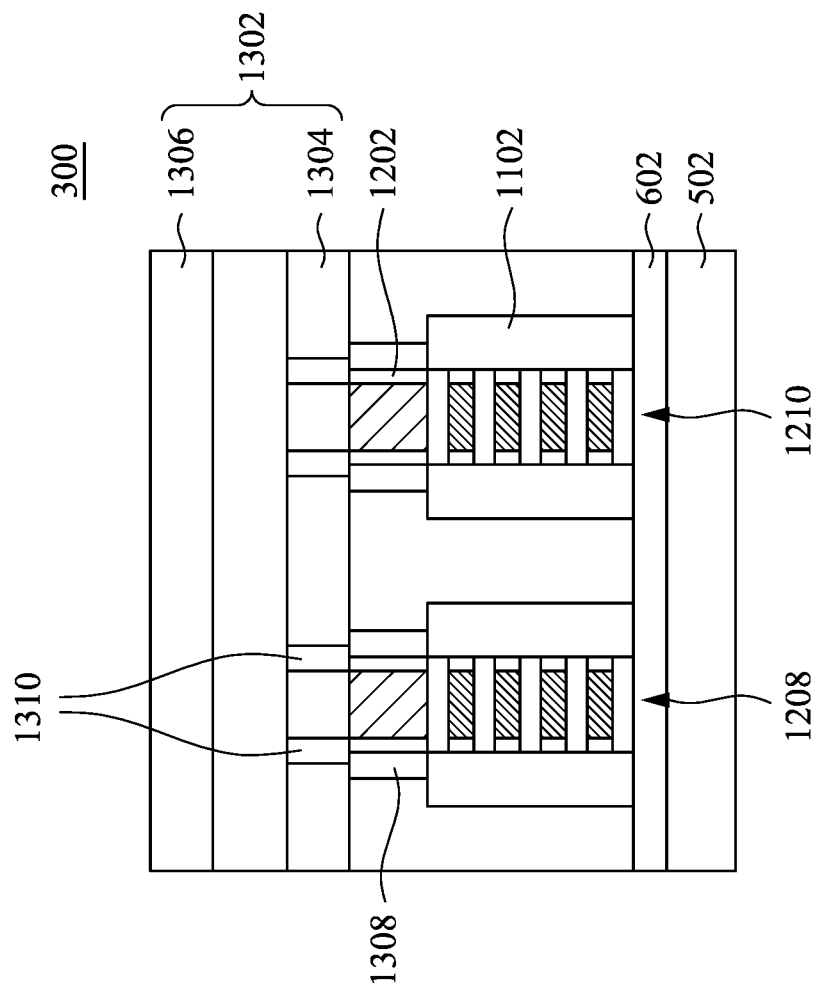

Corresponding to operation 418, FIG. 13 is a cross-sectional view of the semiconductor device 300 including frontside interconnect structures 1302 at one of the various stages of fabrication. The cross-sectional view is cut along A-A indicated in FIG. 3.

In semiconductor device 300, the frontside interconnect structures 1302 include multiple metal layers including first interconnect structure 1304 and n-th interconnect structure 1306. The frontside interconnect structures 1302 can connect one or more of the active gate structures 1202 and/or source/drain structures 1102 of the transistor. For example in FIG. 13, the first interconnecting structure 1304 connects the active gate structures 1202 of GAA transistor 1208 and GAA transistor 1210 together through the gate vias VG formed over the active gate structures 1202. Although not shown, one of ordinary skill will recognize that the frontside interconnect structures 1302 can couple the gates and/or sources and/or drains of the GAA transistors by forming vias and interconnect structures over the GAA transistors.

Figure 14:
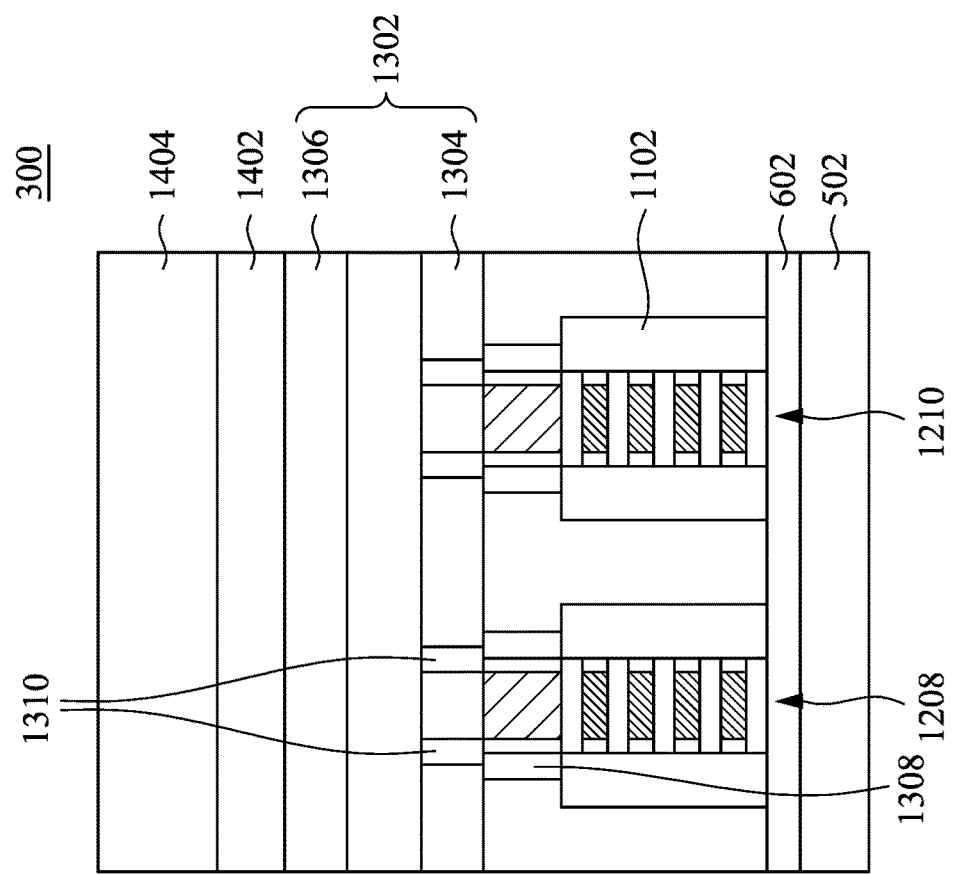

Corresponding to operation 420, FIG. 14 is a cross-sectional view of the semiconductor device 300 including a carrier substrate 1404 at one of various stages of fabrication. The carrier substrate 1404 may be silicon, glass, ceramic, a polymer based material, or a combination of materials. For example, a de-bonding layer such as a light-to-heat conversion release layer may be deposited over a Borosilicate glass body, which may, advantageously, enable the carrier substrate 1404 to be removed from temporarily coupled layers while minimizing thermal expansion and contractions. The semiconductor device 300 may be coupled to a carrier substrate by attaching the device to an intermediate layer 1402 such as an adhesive layer. For example, in some embodiments, the device including frontside interconnect structures 1302 may be attached to the intermediate layer 1402 by the operation of a pick and place machine such that the intermediate layer 1402 bonds the frontside interconnect structure 1302 and the carrier substrate 1404.

In some embodiments, the semiconductor package may include a plurality of semiconductor chips, arranged side-by-side, with a dielectric material interposed therebetween. In some embodiments, a first semiconductor chip and a second semiconductor chip, each including a GAA FET device and frontside interconnect structures, may each be bonded to a carrier substrate. That is, a first carrier substrate is bonded to the first chip and is disposed opposite the first interconnect structures from the first device features, and a second carrier substrate is bonded to the second chip and is disposed opposite to the second interconnect structures. A person of ordinary skill in the art would understand such embodiment based on FIG. 21A. In some other embodiments, e.g. as depicted in FIG. 21B, a single carrier substrate may be bonded to the first and second chips.

Figure 15:
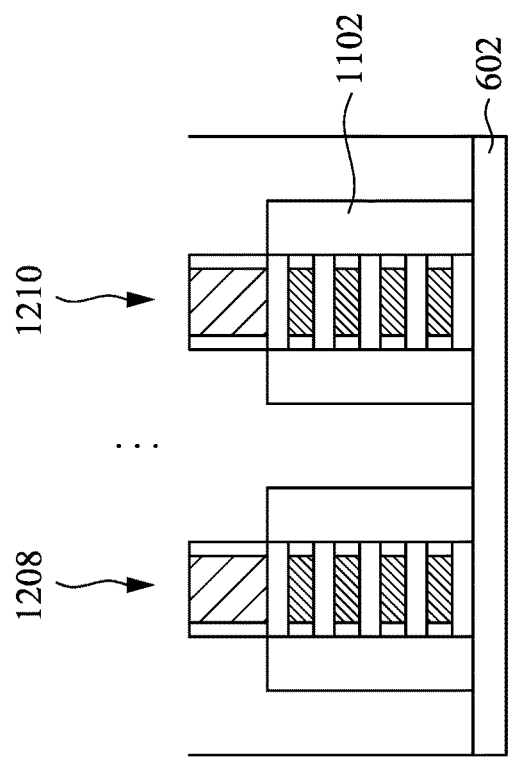

Corresponding to operation 422, FIG. 15 is a cross-sectional view of the semiconductor device 300 in which the buried oxide layer 602 is exposed, one of the various stages of fabrication. The cross-sectional views are cut along A-A indicated in FIG. 3. The buried oxide layer 602 formed in operation 404 can be exposed by thinning down the substrate 502 from its backside. The substrate 502 may be thinned down by, for example, CMP.

Figure 16:
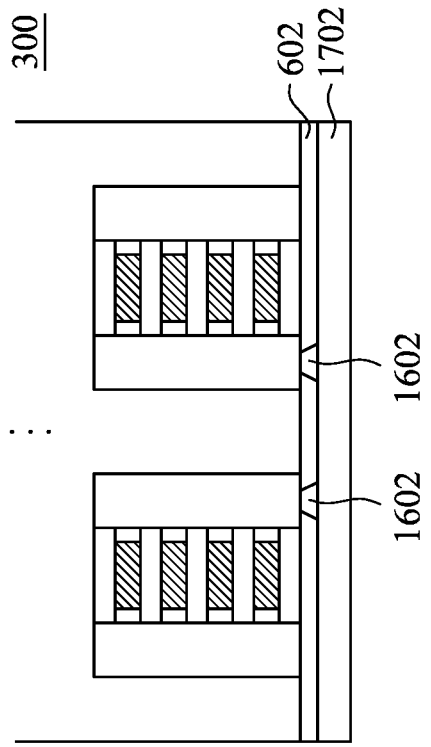

Corresponding to operation 424, FIG. 16 is a cross-sectional view of semiconductor device 300 including backside vias 1602 at one of the various stages of fabrication. The cross-sectional views are cut along A-A indicated in FIG. 3. A portion of the buried oxide layer 602 is etched out and replaced with the backside vias 1602. In various embodiments, these backside vias are formed to carry power to the source/drain structures 1102 from the backside metal formed in the disclosed interposer.

Figure 17:
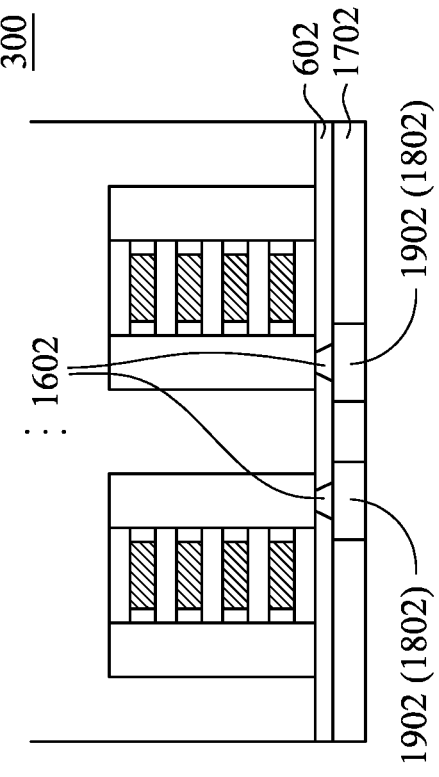

Corresponding to operation 426, FIG. 17 is a cross-sectional view of semiconductor device 300 including another ILD 1702 at one of the various stages of fabrication. The cross-sectional views are cut along A-A indicated in FIG. 3. Referring to FIG. 17, the ILD 1702 is formed over the buried oxide layer 602 and the backside vias 1602. The ILD 1702 may be a low-k spacer and may be formed of a suitable dielectric material, such as silicon nitride, silicon oxide, silicon carbonitride, silicon oxycarbonitride, or the like. Any suitable deposition method, such as thermal oxidation, chemical vapor deposition (CVD), or the like, may be used to form the ILD 1702.

Figure 18:
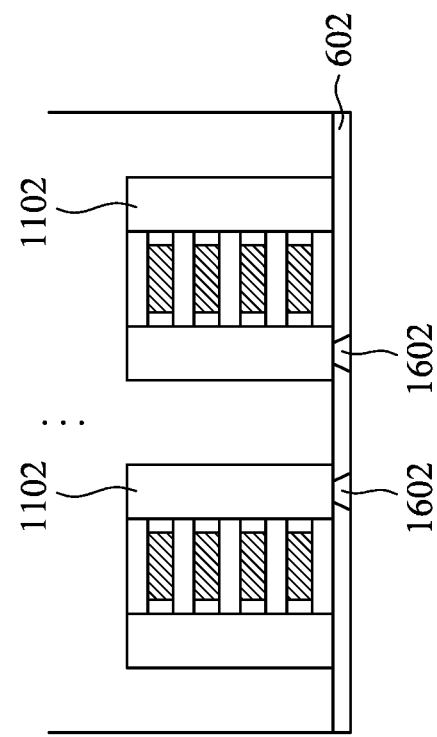

Corresponding to operation 428, FIG. 18 is a cross-sectional view of semiconductor device 300 including one or more openings 1802 at one of the various stages of fabrication. The cross-sectional views are cut along A-A indicated in FIG. 3. The ILD 1702 are etched to form the openings 1802 so as to expose the backside vias 1602, respectively The openings 1802 may have various shapes and are not limited to the ones that are shown in the figures.

Figure 19:
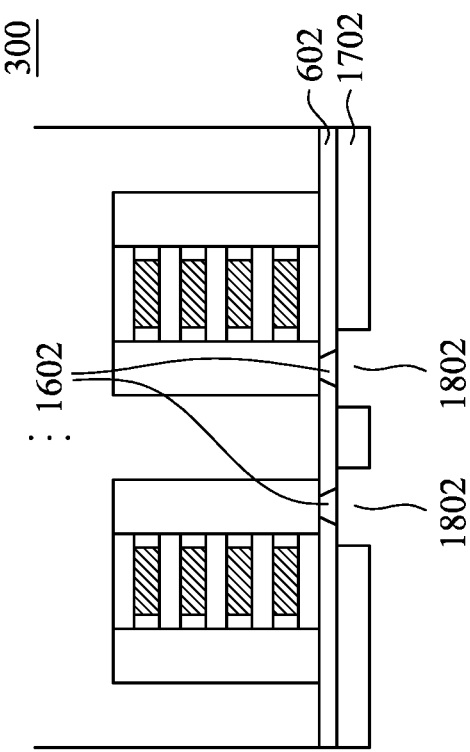

Corresponding to operation 430, FIG. 19 is a cross-sectional view of semiconductor device 300 including one or more backside interconnect structures 1902 at one of the various stages of fabrication. The cross-sectional view is cut along A-A indicated in FIG. 3. The frontside interconnect structures and various layers of the semiconductor devices 300 are omitted from FIG. 19 for simplicity. The backside interconnect structure 1902 may be an example implementation of the backside interconnect structure 106 shown in FIG. 1.

In some embodiments, the backside interconnect structure 1902 is coupled to the backside via 1602 which is coupled to the source/drain structure of the GAA transistors 1208, 1210. In some embodiments, backside interconnect structure 1902 may be coupled to backside via 1602 that is connected to the source/drain structure of the GAA transistor 1208, and not to the backside via 1602 that is connected to the source/drain structure of GAA transistor 1210. In such embodiment, the backside interconnect structure 1902 can carry power to the source/drain structure 1102 of the transistor 1208, but not the transistor 1210. Furthermore, although it may not be shown, the backside interconnect structures 1902 may extend to overlap the backside vias 1602.

It is to be understood that in some embodiments in which the semiconductor package includes a plurality of semiconductor chips, each semiconductor chip would include the plurality of backside interconnect structures. For example, the first chip may further include a plurality of third interconnect structures disposed opposite the first device features from the first interconnect structures, and the second chip may further include a plurality of fourth interconnect structures disposed opposite the second device features from the second interconnect structures.

Figure 20:
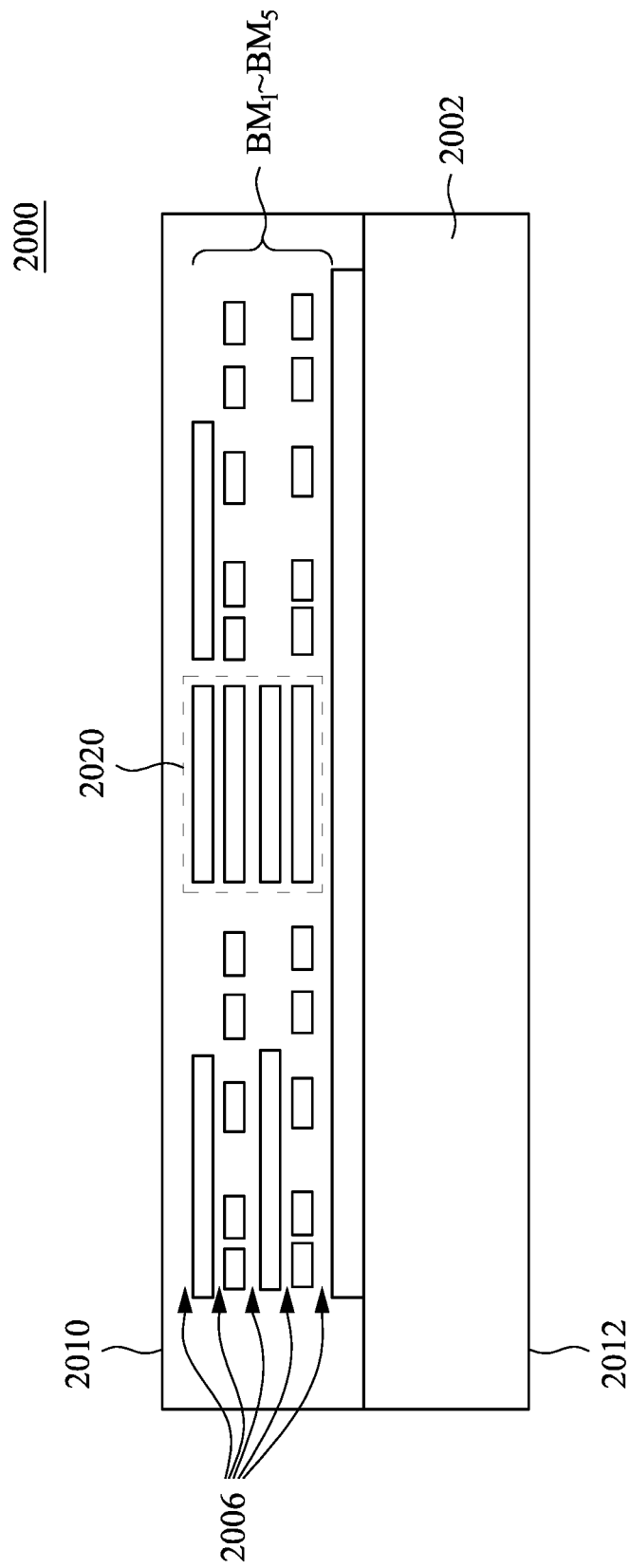
FIG. 20 illustrates cross-sectional view of an example interposer, in accordance with some embodiments.

Referring to FIG. 20, the interposer 2000 may comprise various inductors, resistors, capacitors, etc., which, in combination with further elements of the PDN of the semiconductor device, condition one or more supply voltages or grounds to the semiconductor device. However, for simplicity, features other certain elements are omitted herein.

The depicted interposer comprises a substrate 2002 and a plurality of metallization layers. While FIG. 20 shows five metallization layers (e.g., BM1 to BM5), a person of ordinary skill in the art would understand that any desired number of metallization layers may be included. At least one of the plurality of metallization layers BM1 to BM5 may be a power rail, configured to deliver power to the device features. For example, all metallization layer (e.g. BM1 to BM5) may function as plurality of power rails. Isolating layers 2006 of insulating material may electrically isolate conductive elements. The insulating material may comprise a polymer such as polybenzoxazole (PBO), polyimide, BCB, or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like. The isolating layer may comprise a plurality of vias (not shown) formed in openings of the insulating material, which provide connections between conductive elements. For example, the vias may form electrical, mechanical, and/or thermal connections.

Referring still to FIG. 20, the interposer 2000 has a first side 2010 that is configured to be attached to the backside of the device, and a second side 2012 opposite to the first side. The first metallization layer BM1 is disposed co-planarly with the first side, thus is disposed closer to the chips than the second metallization layer BM2, which is disposed closer to the chips than the third metallization layer BM3, etc. In some embodiments, each metallization layers BM1 to BM5 that function as power rail may have different width. For example, in some embodiments, the first power rail (e.g., metallization layers) BM1 may have a first width that is substantially smaller than the second width of the second power rail (e.g., metallization layers) BM2. In addition, interposer 2000 includes of a plurality of signal lines 2020 configured to propagate signals that are communicated between the first and second chips. The plurality of signal lines 2020 may be composed of a portion of a plurality of metallization layers. For example, the plurality of signal lines may be formed in metallization layers BM2, BM3, BM4, and BM5. Because the two devices are connected at least by the plurality of signal lines, the power rails may supply power to both devices. A person of ordinary skill in the art would understand that this is a non-limiting example, and the plurality of signal lines 2020 may be formed in any metallization layers.

Figure 21A:
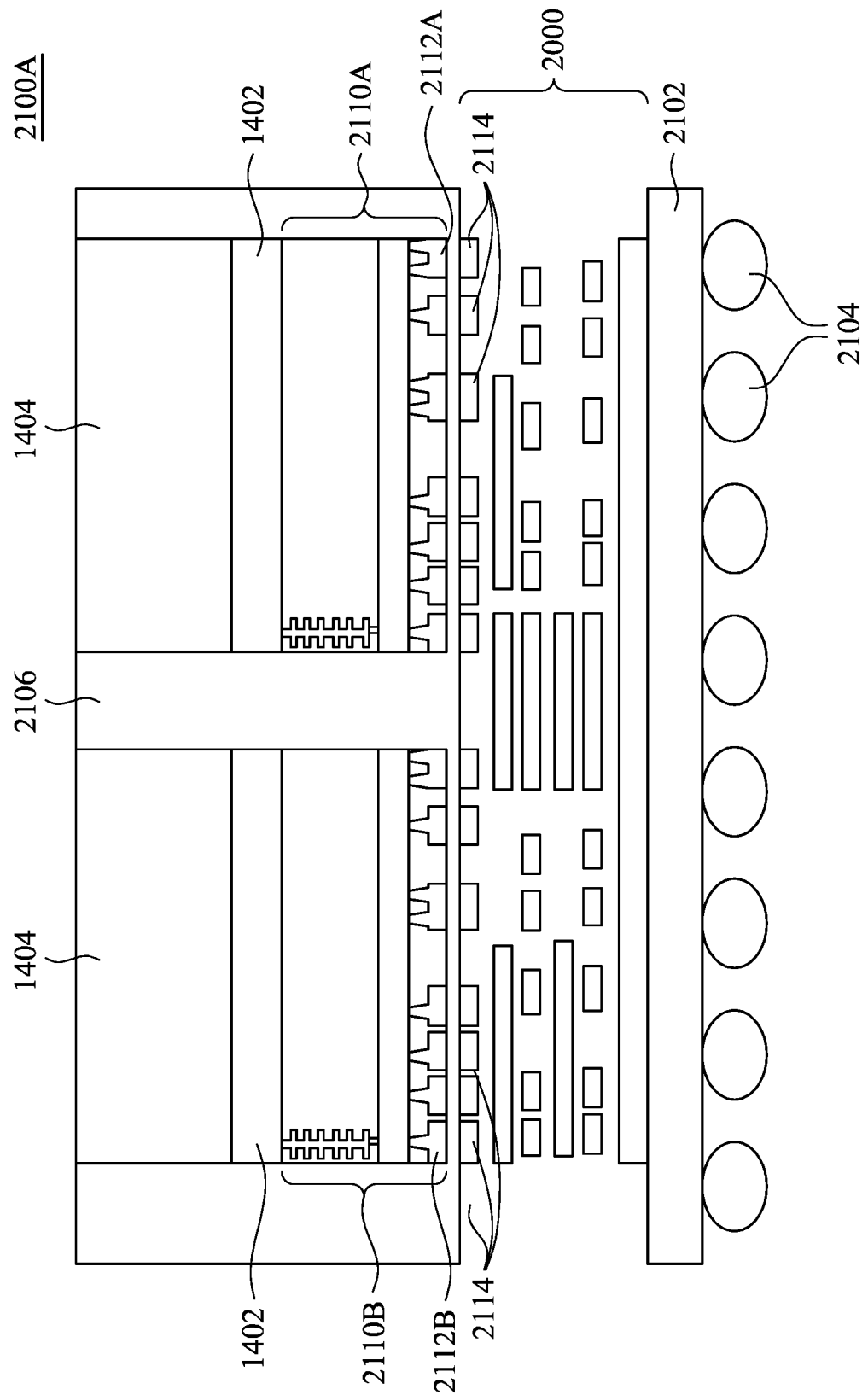
FIGS. 21A-B illustrate cross-sectional views of an example semiconductor package, made by the method of FIG. 1, in accordance with some embodiments.
Figure 21B:
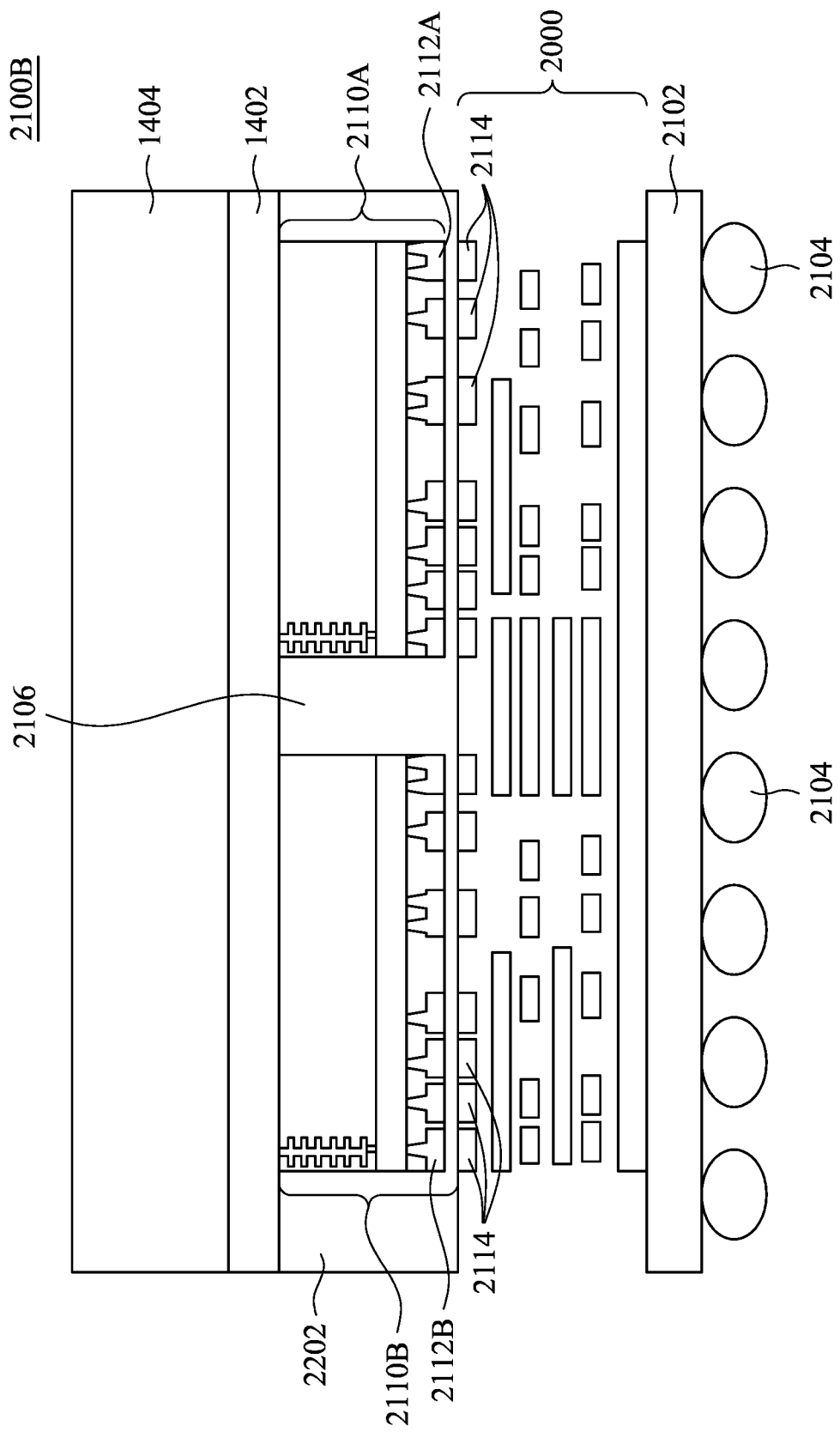

Referring to FIGS. 21A-B, semiconductor packages 2100A, 2100B includes a plurality of semiconductor chips, e.g., 2110A and 2110B, and interposer 2000 coupled to each other. In some embodiments, the plurality of semiconductor chips 2110A, 2110B are arranged side-by-side, with a dielectric material 2106 disposed therebetween. In some embodiments, the semiconductor chips 2110A, 2110B may each be coupled to separate carrier substrates 1404 (as shown in FIG. 21A). In such embodiment, each carrier substrate 1404 occupies an area that is substantially similar to the area occupied by the interconnect structures and the device features. In some embodiments, semiconductor chips 2110A, 2110B may be couple to a single carrier substrate 1404 (e.g., as shown in FIG. 21B). When semiconductor chips 2110A, 2110B are coupled to a single carrier substrate 1404, the single carrier substrate occupies an area that is substantially greater than the area occupied by any of the first or second semiconductor chips that include interconnect structures and device features.

In some embodiments of the present disclosure, a first semiconductor chip 2110A includes a plurality of backside interconnect structures 2112A and a second semiconductor chip 2110B includes a plurality of backside interconnect structures 2112B that are configured to function as respective connectors of the chips 2110A and 2110B to the interposer 2000. The interposer 2000 can also include a plurality of connectors 2114. In various embodiments, at least one of the backside interconnect structures 2112A of the semiconductor chip 2110A and at least one of the backside interconnect structures 2112B of the semiconductor chip 2110B are each in direct contact to at least one of the corresponding connectors 2114 of the interposer 2000, which forms a hybrid bonding interface. Along such an interface, two type of interfaces are included, a first one of which is between metal materials (e.g., 2112A and 2114, 2112B and 2114) and a second one of which is between dielectric materials (e.g., an ILD embedding 2112A/2112B and an ILD embedding 2114).

In some embodiments, the semiconductor package 2100A/2100B further includes a redistribution structure 2102, which may include a number of routing layer (e.g., formed of copper). The redistribution structure 2102 has a first side connected to the interposer 2000 (with the substrate 2002 removed or substantially thinned down). The semiconductor package 2100A/2100B further includes a plurality of bumps 2104 formed on a second side of the redistribution structure 2102.

The plurality of bumps 2104 are configured to receive externally supplied power. The composition of the bumps may be optimized based on desired properties. For example, copper, aluminum, silver, graphene, tin, and various alloys or other combination thereof may be selected. Further, because many interposers comprises inductors, capacitors, or resistors, one skilled in the art will understand that the properties of such device may be designed to minimize thermal heat, and maximize thermal conductively. For example, high value capacitors may minimize generated heat by minimizing ripple currents, and the increased electrode size may decrease thermal resistance through the interposer (e.g., aluminum or copper electrodes can displace Sift within the interposer to reduce thermal resistance, even where the larger electrodes are not electrically required). For similar reasons, low resistance inductors may simultaneously lower generated heat, and increase thermal conductivity.

In one aspect of the present disclosure, a semiconductor package is disclosed. The semiconductor package includes a first chip including a plurality of first device features and a plurality of first interconnect structures disposed above the first device features; a second chip including a plurality of second device features and a plurality of second interconnect structures disposed above the second device features; and an interposer bonded to the first chip and the second chip, and disposed opposite the first and second device features from the first and second interconnect structures; wherein the interposer includes a plurality of power rails configured to deliver power to the first and second chips.

In another aspect of the present disclosure, a semiconductor package is disclosed. The semiconductor package includes an interposer, having a first side and a second side, that includes a plurality of power rails; a first chip bonded to the interposer on the first side; and a second chip bonded to the interposer on the first side; wherein the plurality of power rails are configured to deliver power to both the first and second chips.

In yet another aspect of the present disclosure, a method for fabricating semiconductor package is disclosed. The method includes forming a plurality of first device features over a front side of a first substrate; forming a plurality of first interconnect structures over the first device features; forming a plurality of second device features over a front side of a second substrate; forming a plurality of second interconnect structures over the second device features; coupling the first substrate and second substrate to one or more carrier substrates, with the first and second interconnect structures interposed between the one or more carrier substrates and the first and second device features; forming an interposer including a plurality of power rails; and coupling the first and second device features to the interposer, with the first and second interconnect structures disposed opposite the first and second device features from the interposer.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first chip including a plurality of first device features and a plurality of first interconnect structures disposed above the first device features;
   a second chip including a plurality of second device features and a plurality of second interconnect structures disposed above the second device features; and
   an interposer bonded to the first chip and the second chip, and disposed on an opposite side from the first and second device features with respect to the first and second interconnect structures;
   wherein:
   the interposer includes a plurality of power rails configured to deliver power to the first and second chips;
   the first chip further includes a plurality of third interconnect structures disposed opposite the first device features from the first interconnect structures; and
   the second chip further includes a plurality of fourth interconnect structures disposed opposite the second device features from the second interconnect structures.

2. The semiconductor package of claim 1, further comprising:
   a first carrier substrate bonded to the first chip and disposed opposite the first interconnect structures from the first device features; and
   a second carrier substrate bonded to the second chip and disposed opposite the second interconnect structures from the second device features.

3. The semiconductor package of claim 1, further comprising:
   a single carrier substrate bonded to the first and second chips, wherein the single carrier substrate is disposed opposite the first and second interconnect structures from the first and second device features.

4. The semiconductor package of claim 1, wherein the interposer further includes a plurality of signal lines configured to propagate signals that are communicated between the first and second chips.

5. The semiconductor package of claim 1, wherein the plurality of power rails are arranged across a plurality of metallization layers.

6. The semiconductor package of claim 5, wherein a first one of the plurality of metallization layers is disposed closer to the first and second chips than a second one of the plurality of metallization layers is.

7. The semiconductor package of claim 6, wherein a first power rail in the first metallization layer has a first width and a second power rail in the second metallization layer has a second width, and wherein the first width is substantially less than the second width.

8. The semiconductor package of claim 1, wherein the first chip and the second chip are arranged side-by-side, with a dielectric material interposed therebetween.

9. The semiconductor package of claim 1, wherein:
   the first chip further includes a plurality of first connectors disposed opposite the first device features from the first interconnect structures;
   the second chip further includes a plurality of second connectors disposed opposite the second device features from the second interconnect structures; and
   the interposer further includes a plurality of third connectors, at least one of the first connectors being in direct contact with a corresponding one of the third connectors and at least one of the second connectors being in direct contact with a corresponding one of the third connectors.

10. A semiconductor package, comprising:
    an interposer, having a first side and a second side, that includes a plurality of power rails arranged across a plurality of metallization layers;
    a first chip bonded to the interposer on the first side; and
    a second chip bonded to the interposer on the first side;
    wherein:
    the plurality of power rails are configured to deliver power to both the first and second chips;

a first one of the plurality of metallization layers is disposed closer to the first and second chips than a second one of the plurality of metallization layers; and a first power rail in the first metallization layer has a first width and a second power rail in the second metallization layer has a second width, and wherein the first width is substantially less than the second width.

11. The semiconductor package of claim 10, further comprising a plurality of bump structures disposed on the second side of the interposer.

12. The semiconductor package of claim 10, wherein
the first chip includes a plurality of first device features and a plurality of first interconnect structures, wherein the first interconnect structures are disposed opposite the first device features from the interposer; and
the second chip includes a plurality of second device features and a plurality of second interconnect structures, wherein the second interconnect structures are disposed opposite the second device features from the interposer.

13. The semiconductor package of claim 12, further comprising:
a first carrier substrate bonded to the first chip and disposed opposite the first interconnect structures from the first device features; and
a second carrier substrate bonded to the second chip and disposed opposite the second interconnect structures from the second device features.

14. The semiconductor package of claim 13, wherein the first carrier substrate occupies a first area that is substantially similar to an area occupied by the first interconnect structures and the first device features, and the second carrier substrate occupies a second area that is substantially similar to an area occupied by the second interconnect structures and the second device features.

15. The semiconductor package of claim 12, further comprising:
a single carrier substrate bonded to the first and second chips, wherein the single carrier substrate is disposed opposite the first and second interconnect structures from the first and second device features.

16. The semiconductor package of claim 15, wherein the single carrier substrate occupies an area that is substantially greater than an area occupied by any of the first interconnect structures, the first device features, the second interconnect structures, or the second device features.

17. A method for fabricating semiconductor packages, comprising:
forming a plurality of first device features over a front side of a first substrate;
forming a plurality of first interconnect structures over the first device features;
forming a plurality of second device features over a front side of a second substrate;
forming a plurality of second interconnect structures over the second device features;
coupling the first substrate and second substrate to one or more carrier substrates, with the first and second interconnect structures interposed between the one or more carrier substrates and the first and second device features;
forming an interposer including a plurality of power rails arranged across a plurality of metallization layers, wherein a first one of the plurality of metallization layers is:
formed in a first metallization layer closer to the first and second device features than a second one of the plurality of metallization layers formed in a second metallization layer; and
substantially less wide than the second one of the plurality of metallization layers; and
coupling the first and second device features to the interposer, with the first and second interconnect structures disposed on an opposite side from the first and second device features with respect to the interposer.

18. The method of claim 17, further comprising:
forming a plurality of first connectors over a back side of the first substrate;
forming a plurality of second connectors over a back side of the second substrate; and
forming a plurality of third connectors over the plurality of power rails;
wherein the first and second device features are coupled to the interposer, with at least one of the first connectors being in direct contact with a corresponding one of the third connectors and at least one of the second connectors being in direct contact with a corresponding one of the third connectors.

19. The method of claim 17, wherein the plurality of power rails are configured to deliver power to both the first and second device features.

20. The method of claim 17, wherein the one or more carrier substrates consist of a single carrier substrate, and further comprising forming an intermediate layer over the single carrier substrate, the intermediate layer configured to adhere the single carrier substrate with the first and second substrates.

* * * * *